United States Patent [19]

Baldi et al.

[11] Patent Number: 4,806,501
[45] Date of Patent: Feb. 21, 1989

[54] METHOD FOR MAKING TWIN TUB CMOS DEVICES

[75] Inventors: Livio Baldi, Agrate Brianza; Paolo G. Cappelletti, Seveso, both of Italy

[73] Assignee: SGS Microelettronica S.p.A., Catania, Italy

[21] Appl. No.: 75,718

[22] Filed: Jul. 20, 1987

[30] Foreign Application Priority Data

Jul. 23, 1986 [IT] Italy ................ 21235 A/86

[51] Int. Cl.$^4$ ......................................... H01L 21/314
[52] U.S. Cl. .................................. 437/67; 437/56; 437/29; 437/149; 437/78; 437/68; 148/DIG. 103
[58] Field of Search .................. 437/70, 29, 34, 69, 437/57, 58, 67, 56, 28, 149; 148/DIG. 103

[56] References Cited

U.S. PATENT DOCUMENTS

| | | | |
|---|---|---|---|
| 4,412,375 | 11/1983 | Matthews | 437/70 |
| 4,435,896 | 3/1984 | Parrillo et al. | 437/69 |
| 4,459,741 | 7/1984 | Schwabe et al. | 437/69 |
| 4,463,493 | 8/1984 | Momose | 437/34 X |
| 4,525,920 | 7/1985 | Jacobs et al. | 437/34 |
| 4,613,885 | 9/1986 | Haken | 437/57 |
| 4,692,992 | 9/1987 | Hsu | 437/57 |
| 4,707,455 | 11/1987 | Tsang et al. | 437/57 |

FOREIGN PATENT DOCUMENTS 0004236 1/1985 Japan ................... 437/29

*Primary Examiner*—Brian E. Hearn
*Assistant Examiner*—T. N. Quach
*Attorney, Agent, or Firm*—Guido Modiano; Albert Josif

[57] ABSTRACT

A method is disclosed for making twin tub devices with trench isolation. The trench mask is obtained in a self-aligned manner employing tub masks that define an overlapping region at the trench. In one embodiment, the N-tub mask is defined by patterning resist (4) and polysilicon (3) overlying silicon oxide (2). The P-tub mask is defined by patterning resist (9). The oxide at the overlapping region between the tubs is removed, resulting in trench mask (2', 2'') for forming trench (15). In another embodiment, the N-tub mask is defined by patterning resist (23) and silicon nitride (22). The P-tub mask is then defined by patterning resist (27) and nitride (22'). Self-aligned oxide regions (31) formed around nitride (22')serve as a trench mask for forming trench (32).

9 Claims, 2 Drawing Sheets

METHOD FOR MAKING TWIN TUB CMOS DEVICES

BACKGROUND OF THE INVENTION

The present invention relates to a method for making twin tub integrated devices, in particular twin tub CMOS devices.

To manufacture advanced twin tub CMOS devices on almost intrinsic substrates with the known methods, starting from lightly doped, at the limit intrinsic, substrates two tubs are formed with opposite conductivity type (P and N) in which N and P-channel transistors are respectively formed. In order to reduce latch-up problems (that is, switching on of parasite SCR structures) and to obtain more compact circuits, the two doping tubs are separated by a trench, consisting of a digging in the silicon substrate obtained by means of a suitable mask and unidirectional physicalchemical etching of the silicon (reactive ion etching R.I.E.). Subsequently this trench is filled with insulating material by chemical vapor-phase deposition (CVD) of oxide or polysilicon, followed by the planarization of the structure.

A typical process sequence, according to the prior art, comprises the steps of: growing an initial oxide on a semiconductor substrate, deposition of the trench mask, oxide etching and silicon etching to form the trench, oxidation of the trench walls; deposition of polysilicon for filling the trench; planarization of the obtained structure; deposition of the P-tub mask and boron implant; deposition of the N-tub mask and phosphorus implant; diffusion of the two tubs; removal of the surface oxide and deposition of oxide and nitride layers; and the usual steps for the formation of CMOS devices.

This known method has several variations, with the tubs formed before opening the trench, with other methods for filling said trench and with other protection layers. However all these variated embodiments have in common the use of distinct masking steps for forming the masks for the N and P tubs, and for the trench.

SUMMARY OF THE INVENTION

Thus, the aim of the present invention is to provide a method for making twin tub CMOS devices which allows a reduction of the masking steps required to obtain CMOS devices, allowing saving the manufacture time and lowering the production costs.

Within this aim, a particular object of the present invention is to provide a method which does not entail significant complications in the process steps required for carrying out the method and which does not require the use of machines different from the ones currently in use.

Still another object of the present invention is to provide a method which allows to obtain CMOS devices of reliable quality and in any case completely comparable to CMOS devices made according to the prior art process.

The aim described, the objects mentioned, and others which will become apparent hereinafter, are achieved by a method for making twin tub CMOS devices, according to the invention, as defined in the accompanying claims.

BRIEF DESCRIPTION OF THE DRAWINGS

The characteristics and advantages of the invention will become apparent from the description of two preferred, but not exclusive, embodiments illustrated only by way of non-limitative example in the accompanying drawings, wherein.

DESCRIPTION OF THE PREFERRED EMBODIMENTS

Reference should initially be made to FIGS. 1 to 5, illustrating a first embodiment.

Figure 1:
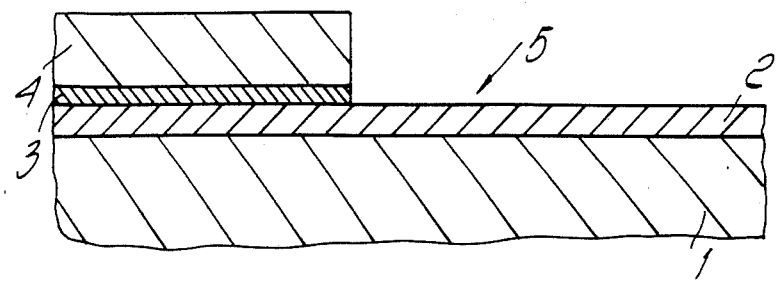
FIGS. 1 to 5 are cross section views of a silicon wafer to illustrate different steps of a first embodiment of the method according to the invention.

According to this embodiment, starting from a semiconductor substrate 1, for example silicon, a layer of silicon oxide (typically 2000–3500 Å) indicated at 2 in the figures, is grown. Subsequently, a polysilicon layer is deposited with thickness typically comprised between 500 and 1000 Å, then the N-tub mask is formed in a per se known manner. Thus, a resist layer 4 is deposited on the preceding structure and, according to this first embodiment, defines a window 5 at the region at which the N tub and the separation trench are to be formed. Subsequently, a physical-chemical etching of the polysilicon, selective with respect to the oxide, is performed. Thus the structure illustrated in FIG. 1 is obtained, wherein the polysilicon layer 3 is left only under the resist 4.

Figure 2:
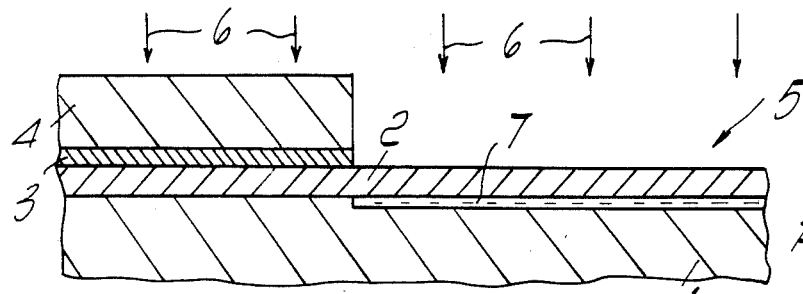
Figure 3:
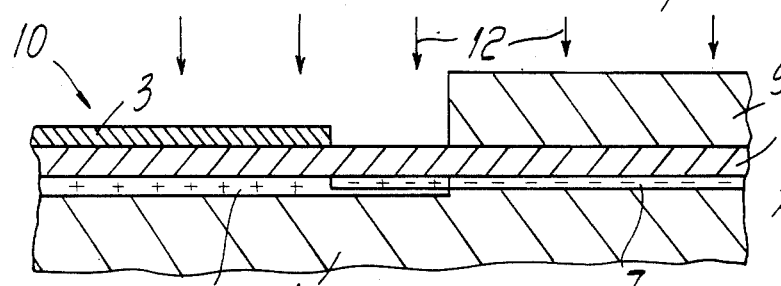
Figure 4:
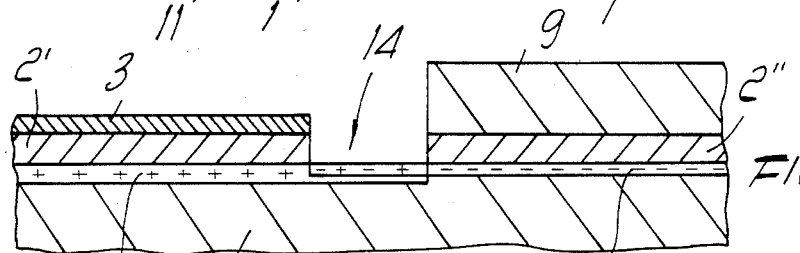

Subsequently, at the window 5, phosphorus is implanted (typically at 200–250 KeV) to obtain the N tub, as symbolized in FIG. 2 by the arrows 6. Accordingly, on the surface of the substrate 1 at the window 5, there is an accumulation of phosphorus atoms, as indicated symbolically by the small layer 7. Then the resist layer 4 is removed and the remaining structure is masked to obtain the P tub. According to this first embodiment, the P tub mask is obtained by depositing a resist layer 9 which has a window 10 at the region at which the P tub and the trench are to be provided. In practice, the resist mask 9 has a window which is ideally partially superimposed to the window 5 defined by the mask 4, and more precisely it is superimposed at the trench region. Then boron is implanted through the polysilicon layer 3 and the oxide layer 2, as symbolized by the arrows 12 of FIG. 3. Accordingly there is an accumulation of boron atoms on the surface of the substrate 1 at the window 10, as indicated in FIG. 3 by the small layer 11.

Subsequently, employing the mask formed by the resist layer 9 and the polysilicon layer 3, an oxide etching step, selective with respect to silicon, is performed. Due to this etching, the uncovered portion of the silicon oxide layer 2 is removed, forming an opening or window 14 over the trench region, obtaining the portions 2' and 2" of the oxide. In this manner, without the need for a specific masking step, the trench mask formed by the portions 2', 2" is achieved.

Figure 5:
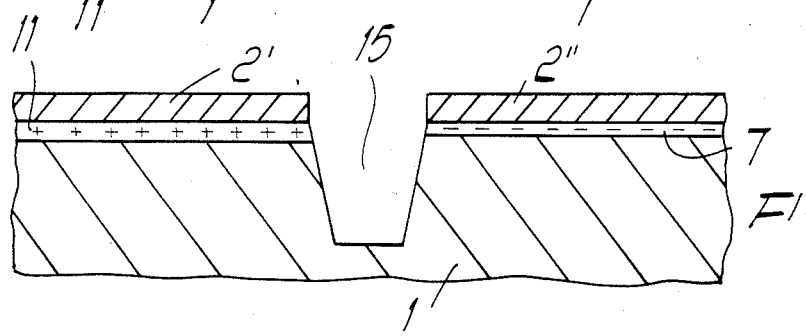

Successively, the resist layer 9 is removed and the silicon substrate is etched (selectively with respect to the oxide) with the formation of the trench 15. The structure of FIG. 5 is thus obtained, from which the oxide layer 2', 2" is then removed. Then the further steps for the completion of the device are performed, comprising oxidation of the wall of the trench with the formation of an oxide layer, filling of the trench with polysilicon, planarization of the structure with formation of a surface oxide layer and finally diffusion of the boron and phosphorus atoms so as to obtain the two tubs with opposite conductivity type and the interposed insulating region. Subsequently the process continues like a normal CMOS process for obtaining finished devices.

Accordingly, as explained above, in the illustrated embodiment, the trench mask is obtained in a self-aligned manner without the need of a specific masking step by providing a substrate masking layer (herein consisting of the oxide layer 2) the window whereof is obtained automatically by oversizing the windows of the tubs masks so that they overlap exactly at the trench region.

According to a different embodiment of the invention, instead, the masks are sized in an opposite manner, that is, so that their protection portions ideally overlap.

Figure 6:
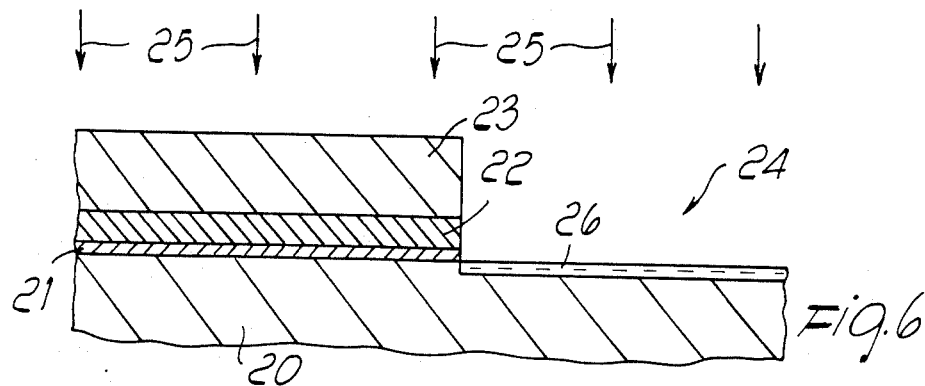
FIGS. 6 to 9 are similar cross section views to illustrate a different embodiment of the method according to the invention.

According to this second embodiment of the invention, again starting from a semiconductor substrate 20, for example silicon, a thin oxide layer (typically 100–500 Å) is grown, indicated at 21 in FIG. 6. Subsequently, a silicon nitride layer 22, with thickness comprised between 1000 and 2000 Å, is deposited. Then the N-tub mask is formed, depositing a resist layer 23 on the nitride layer and forming a window 24. In this second embodiment, the window 24 of the first mask is formed only at the region where the first tub is to be provided.

Subsequently, the nitride layer is etched away at the window 24, which etching can be selective or not with respect to the oxide, thus removing the portion of the nitride layer 22 and eventually of the oxide layer 21 at said window.

Then phosphorus is implanted to obtain the N tub, as symbolized in FIG. 6 by the arrows 25. Accordingly, on the surface of the substrate 20, at the window 24, there is an accumulation of phosphorus atoms as indicated symbolically by the layer 26. Then the resist 23 is removed and the second masking is performed to obtain the P tub. According to this embodiment, the second mask is formed so as to have a window only at the region where the P tub is to be provided. Accordingly, a resist layer 27 is deposited which covers the trench region as well as all the rest of the surface of the substrate which must not be implanted with boron, forming a window 28 only at the P tub. Thus, as can be noted in the figure, according to this embodiment the procedure is exactly opposed to the previous embodiment, since the two tub masks are superposed with their protective portions formed by the resist layer, and no longer with the windows, as in the previous embodiment.

Figure 7:
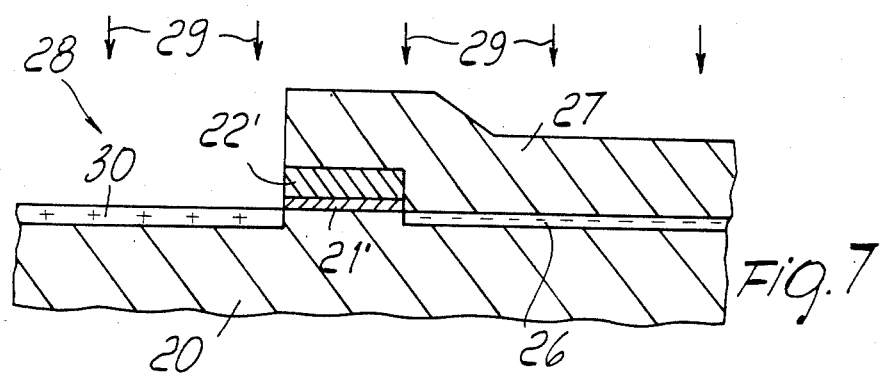
Figure 8:
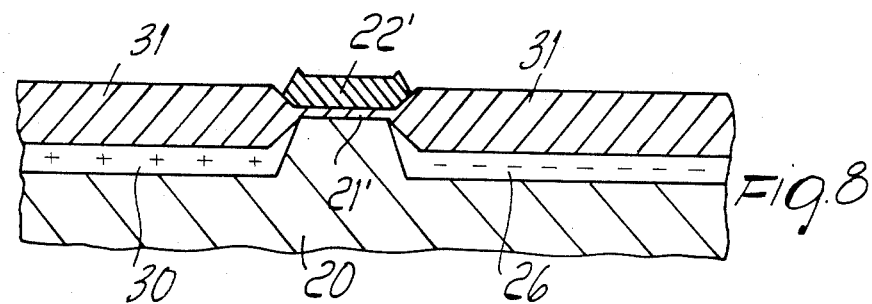
Figure 9:
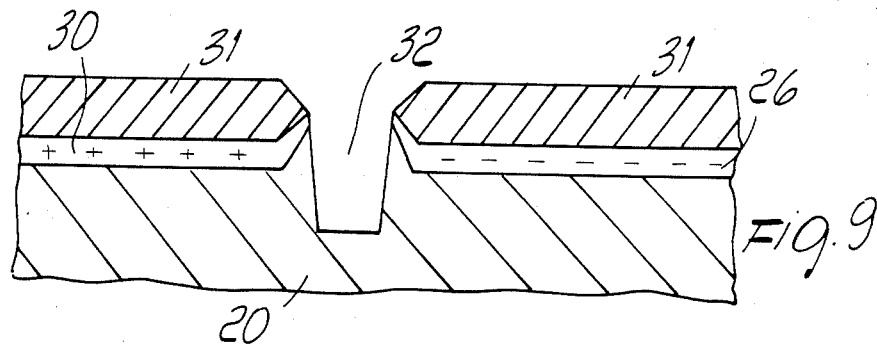

Subsequently, at the window 28, nitride etching is performed, leaving the nitride layer only at the portion 22' over the trench region. Then boron is implanted, as symbolized in FIG. 7 by the arrows 29. Then the resist layer 27 is removed and then a nitride mask is obtained which exactly constitutes the negative of the mask 2, 2" of the previous embodiment.

By employing this mask 22', the surface of the substrate 20 is then subject to thermal oxidation thus forming an oxide layer 31 with thickness comprised between 2000 and 4000 Å at the region not covered by the nitride 22'. Then the nitride 22' is removed by selectively etching with respect to oxide, and then the initial oxide is removed. At this point a structure is achieved consisting of the substrate 20 with the small layers 26 and 30 of accumulation of the implanted atoms, having on its surface a masking layer 31 composed of thermal oxide covering all the surface of the substrate except for the region where the trench is to be provided. By employing this window, the substrate is then etched, forming the trench by virtue of the screening of the thermal oxide.

The method then proceeds like the previous one with the total removal of the oxide, reoxidation of the walls of the trench, filling thereof and the further steps up to the completion of the device.

Accordingly, also in this case, the tubs and the insulating trench layer are obtained by means of only two masking steps, employing a masking layer composed here of the grown thermal oxide and sizing the tub masks so that they define in themselves the limits of the trench, with a process negative with respect to the previous one.

Naturally, several other variations and embodiments of the method are possible, all employing the idea of covering the substrate with at least one layer which is used to screen or shield the substrate and can be etched selectively with respect to the substrate material, and shaping and configuring appropriately this covering layer by using the two tub masks, by virtue of a suitable sizing of the latter.

In particular, it should be noted that the thicknesses indicated are purely indicative and their values are determined only by the need to screen particular etchings or to allow implanting through them. In particular in the first embodiment, the minimum thickness of the oxide 2 is determined by the need to screen the trench etch while its maximum thickness is conditioned by the need to implant through it the phosphorus of the N tub. Conversely, the minimum thickness of the polysilicon layer 3 is related to the need to screen the oxide 2 during the oxide etching to form the window 14, while its maximum thickness depends on the need to implant boron through the oxide and the polysilicon.

It should be noted that the implanting order of the atoms to obtain the N and P tubs can be reversed. This reversal can be freely performed in the second embodiment according to FIGS. 6 to 9, while as to the first embodiment it entails an increase in technological difficulties.

Moreover, regarding the first illustrated embodiment, it is possible to replace the polysilicon layer 3 with a nitride layer. In this case the nitride layer has to satisfy the above mentioned conditions relatively to its thickness, but technologically according to this embodiment it is more difficult to obtain a satisfactory selectivity between the nitride and the oxide by means of chemical-physical etching (R.I.E.). If required, it is possible to use wet chemical etchings which yield good selectivity, but lesser dimensional control.

Moreover, instead of the oxide and of the polysilicon according to the first embodiment, it is possible to provide other materials such as for example alumina. However they must meet the following conditions:

(1) the first layer (in contact with the substrate) must screen the substrate from the trench etching, (2) the second layer must be able to screen the first layer from the etching, (3) it must be possible for the phosphorus implant to traverse the first layer, (4) it must be possible for the boron implant to traverse the sum of the two first layers.

Thus, three-level systems are also possible, for example comprising an oxide layer, a nitride layer as well as an oxide layer, in which the first oxide, typically very thin, has the mechanical function of promoting the adhesion of the nitride to the substrate, as occurs for the thin oxide layer 21 of the second embodiment. In this case the first two layers act like the first layer of the two-level system.

The above is naturally also valid for the second embodiment, taking into account the characteristics thereof. In particular, also in the second embodiment each of the layers can be replaced with a multilayer having the same functional characteristics.

The invention thus conceived is susceptible to numerous modifications and variations, all of which are within the scope of the inventive concept. In particular, besides the indicated variations, it should be stressed that the sequence of the steps indicated can also change with respect to the one illustrated, so long as the same results are achieved.

Moreover, all the details may be replaced with other technically equivalent ones.

We claim:

1. Method for making twin tub integrated devices, in particular of twin tub CMOS devices, comprising:
   forming a first masking layer on the substrate, for masking said substrate,
   forming a second masking layer on said first masking layer for masking said first masking layer,
   patterning said second masking layer to obtain a first window at a first tub region and at a trench region,
   introducing conductivity determining impurities into said substrate through said first window to form a first tub at said first tub region,
   forming of a further masking layer, on said first masking layer, to obtain a mask having a second window at a second tub region and at said trench region,
   introducing further conductivity determining impurities into said substrate through said second window to form a second tub at said second tub region,
   removing exposed portions of said first masking layer to obtain a third window in said first masking layer at said trench region,
   forming the trench at said third window.

2. Method according to claim 1 wherein, said first masking layer is a thermally grown silicon oxide layer, and said second masking layer is deposited polycrystalline silicon.

3. Method according to claim 1, wherein, said first masking layer has a thickness of 2000–3500 Å and said second masking layer has a thickness of 500–1000 Å.

4. Method according to claim 1 wherein, said steps of introducing conductivity determining impurities selectively comprise implant of phosphorus and of boron.

5. Method for making twin tub integrated devices, in particular of twin tub CMOS devices, comprising:
   forming a first masking layer on the substrate, for masking said substrate,
   forming a second masking layer on said first masking layer for masking said first masking layer,
   patterning said second masking layer to obtain a first window at a first tub region,
   introducing conductivity determining impurities into said substrate through said first window to form a first tub at said first tub region,
   forming of a further masking layer, on said first masking layer at said first tub region and a trench region, to obtain a mask having a second window at a second tub region,
   removing exposed portions of said first and said second masking layer.
   introducing further conductivity determining impurities into said substrate through said second window to form a second tub, at said second tub region,
   removing said further masking layer,
   growing of a third masking layer on the exposed surface portions at said first and said second tub region, on said substrate, to form a trench mask with third window at said trench region,
   removing said first and said masking layer at said trench region,
   etching the trench through said third window.

6. Method according to claim 5 wherein said first layer is an oxide layer having thickness between 100 and 500 Å.

7. Method according to claim 4 wherein said second layer is a silicon nitride layer having the thickness between 1000 and 2000 Å.

8. Method according to claim 5 wherein said third layer is an oxide layer having the thickness between 2000 and 4000 Å.

9. Method according to claim 5, wherein, said steps of introducing conductivity determining impurities selectively comprise implant of phosphorus and of boron.

* * * * *